United States Patent
Kitaoka et al.

(10) Patent No.: US 7,987,398 B2
(45) Date of Patent: Jul. 26, 2011

(54) RECONFIGURABLE DEVICE

(75) Inventors: Toshirou Kitaoka, Kanagawa (JP); Taro Fujii, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 415 days.

(21) Appl. No.: 12/213,959

(22) Filed: Jun. 26, 2008

(65) Prior Publication Data
US 2009/0013219 A1 Jan. 8, 2009

(30) Foreign Application Priority Data
Jul. 2, 2007 (JP) ................. 2007-174107

(51) Int. Cl.
- G01R 31/28 (2006.01)
- G11C 29/00 (2006.01)
- G06F 13/00 (2006.01)
- G06F 7/38 (2006.01)

(52) U.S. Cl. .......... 714/725; 714/723; 714/719; 326/39; 710/107

(58) Field of Classification Search .............. 714/725, 714/723, 719; 326/39; 710/107
See application file for complete search history.

(56) References Cited

U.S. PATENT DOCUMENTS

| | | | |
|---|---|---|---|
| 4,860,333 A * | 8/1989 | Bitzinger et al. | 379/15.01 |
| 5,515,517 A * | 5/1996 | Nozuyama et al. | 712/43 |
| 6,738,891 B2 | 5/2004 | Fujii et al. | |
| 6,957,403 B2 * | 10/2005 | Wang et al. | 716/103 |
| 7,325,179 B2 * | 1/2008 | Sasakura | 714/718 |
| 7,331,032 B2 * | 2/2008 | Wang et al. | 716/103 |
| 7,350,054 B2 | 3/2008 | Furuta et al. | |
| 2001/0018733 A1 | 8/2001 | Fujii et al. | |
| 2003/0046513 A1 | 3/2003 | Furuta et al. | |
| 2007/0011578 A1 | 1/2007 | Lewis et al. | |
| 2008/0134107 A1 * | 6/2008 | Wang et al. | 716/2 |

FOREIGN PATENT DOCUMENTS

| | | | |
|---|---|---|---|
| JP | 01095315 A | * | 4/1989 |
| JP | 2-32620 | | 2/1990 |
| JP | 5-327477 | | 12/1993 |
| JP | 2000056874 A | * | 2/2000 |
| JP | 2001-312481 | | 11/2001 |
| JP | 2003-76668 | | 3/2003 |
| JP | 3496661 | | 11/2003 |
| JP | 2006-344223 | | 12/2006 |

OTHER PUBLICATIONS

Wirthlin et al., Reliability of Programmable Input/Output Pins in the Presence of Configuration Upsets, Sep. 2002, pp. 1-10.*

* cited by examiner

*Primary Examiner* — John J Tabone, Jr.
(74) *Attorney, Agent, or Firm* — McGinn Intellectual Property Law Group, PLLC

(57) ABSTRACT

Disclosed is a reconfigurable device including at least a bus that mutually connects functional blocks, a configuration information memory disposed corresponding to each of the functional blocks, an error detection circuit that detects an error in the configuration information memory, and a buffer which is on-off controlled based on information stored in the configuration information memory and each of which controls connection between each of the functional blocks and each bus. When an error in the configuration information memory is detected by the error detection circuit, the buffer with an output thereof connected to the bus is set to an off-state, based on a result of error detection.

28 Claims, 8 Drawing Sheets

RECONFIGURABLE DEVICE

REFERENCE TO RELATED APPLICATION

This application is based upon and claims the benefit of the priority of Japanese patent application No. 2007-174107, filed on Jul. 2, 2007, the disclosure of which is incorporated herein in its entirety by reference thereto.

TECHNICAL FIELD

The present invention relates to a semiconductor device. More specifically, the invention relates to a reconfigurable device capable of programmably implementing various functions.

BACKGROUND

Currently, as processor units capable of implementing various data processing, products which are referred to as so-called CPUs (Central Processing Units) and MPUs (Micro Processor Units) have been practically utilized. In a data processing system that employs such a processor unit, various application programs with a plurality of instruction codes described therein and various data to be processed are stored in a memory device. The processor unit sequentially reads out the instruction codes and the data to be processed from the memory device to execute a plurality of operation processing one by one. For this reason, one processor unit can implement various data processing. However, in data processing, since it is necessary to sequentially execute a plurality of operation processing one by one, the processor unit reads an instruction code from the memory device for each sequential processing. For this reason, it is difficult to execute complex data processing accompanying a plurality of operation processing with one processor unit at high speed.

On the other hand, when data processing to be executed is limited to one in advance, the logic is formed by a hardware circuit (which is referred to as hard-wired logic) so as to execute the limited data processing. It is not thereby necessary for the processor unit to sequentially read a plurality of instruction codes from the memory device and sequentially execute a plurality of operation processing one by one. For this reason, it is possible to execute the limited data processing at high speed. However, only one data processing can be executed (which lacks in versatility).

In a data processing system in which an application program to be executed can be switched, various data processing will be executed. However, a hardware configuration is fixed, so that it is difficult to execute data processing at high speed. On the other hand, in a logic circuit formed of hardware, it is possible to execute data processing at high speed. However, an application program capable of being executed cannot be changed. Only one data processing can be thereby executed.

A reconfigurable device occupies an intermediate position between these two extreme examples. This device can be reconfigured to a different predetermined configuration as necessary. Accordingly, the reconfigurable device will provide the possibility of a computer that changes hardware resources so that a current computational need is satisfied, by an appropriate reconfiguration.

A reconfigurable device includes a plurality of small-scale functional blocks arranged in a matrix form. In response to an application program, operations of the functional blocks and mutual connecting relationships among operators connected by programmable wiring resources are varied. When an application program to be executed is changed, a hardware configuration of the configurable device changes. For this reason, the configurable device can execute various data processing. Further, in the configurable device, the small-scale functional blocks respectively execute operation processing in parallel. Data processing can be thereby executed at high speed.

As the reconfigurable device of which a hardware configuration changes corresponding to software, a device disclosed in Patent Document 1 (JP Patent Kokai Publication No. JP-P-2003-76668A) and a device disclosed in Patent Document 2 (JP Patent Kokai Publication No. JP-P-2001-312481A) are known. As a specific configuration example of wiring resources for the reconfigurable device, a description in Patent Document 3 (JP Patent No. 3496661) is referred to. As measures when configuration information in a configuration information memory of the reconfigurable device becomes incorrect, descriptions in Patent Document 4 (JP Patent Kokai Publication No. JP-A-2-032620), Patent Document 5 (JP Patent Kokai Publication No. JP-A-5-327477), and Patent Document 6 (JP Patent Kokai Publication No. JP-P-2006-344223A) are referred to.

[Patent Document 1]
JP Patent Kokai Publication No. JP-P-2003-76668A
[Patent Document 2]
JP Patent Kokai Publication No. JP-P-2001-312481A
[Patent Document 3]
JP Patent No. 3496661
[Patent Document 4]
JP Patent Kokai Publication No. JP-A-2-032620
[Patent Document 5]
JP Patent Kokai Publication No. JP-A-5-327477
[Patent Document 6]
JP Patent Kokai Publication No. JP-P-2006-344223A

SUMMARY OF THE DISCLOSURE

Description contents of the Patent Documents described above are incorporated herein by reference.

The following is a result of analysis by inventors of the present invention.

The reconfigurable device can implement various processing by freely changing connecting relationships among the functional blocks by the programmable wiring resources.

As the wiring resources inside the reconfigurable device, a bidirectional bus that uses a tri-state buffer or a pass transistor is often used, as disclosed in Patent Document 3 (JP Patent No. 3496661), for example. One of reasons for that is that, when a bus is formed using the bidirectional line, a connecting relationship with a high degree of freedom can be implemented, with a smaller area than when a plurality of unidirectional lines are used. FIG. 7 is a diagram for explaining a configuration of the reconfigurable device described in Patent Document 3 or the like. The reconfigurable device includes functional blocks 201 disposed in a two-dimensional array form and bidirectional buses 202 and 203 respectively laid down in horizontal and vertical directions, corresponding to respective rows and columns of the functional blocks disposed in the two-dimensional array form.

A programmable switch for changing a connecting relationship in the reconfigurable device is controlled by a storage element (referred to as a "configuration information memory") such as a memory or a flip-flop. In the configuration described in Patent Document 3 (shown in FIG. 5 of JP Patent Publication No. 3496661), selection between an output enable state and an output disable state (indicating that an output is in a high-impedance state (Hi-z)) for the tri-state buffer as well is determined by a value of the configuration information memory.

FIG. 8 shows an example of the configuration disclosed in Patent Document 3. The configuration information memory in FIG. 5 of Patent Document 3 is formed of the flip-flop. As shown in FIG. 8, output signals of a configuration information memory 204 provided corresponding to a functional block 201 are connected to output control terminals of tri-state buffers 206-1 and 206-2, respectively. The tri-state buffers 206-1 and 206-2 receive an output of the functional block 201, and outputs of the tri-state buffers 206-1 and 206-2 are connected to bidirectional buses 202-1 and 202-2. An output signal of the configuration information memory 204 is connected to respective output terminals of tri-state buffers 205-1 and 205-2 inserted into the bidirectional bus 202-1. The configuration information memory 204 thereby performs switching control over the tri-state buffers between the output enable state and the output disable state (with respective outputs of the tri-state buffers being in the high-impedance state). A selector 207 receives an output of the configuration information memory 204 as a selection control signal, selects one of the bidirectional buses 202-1, 202-2, . . . and the like, for connection to the functional block 201. Output signals (indicating configuration information) of the configuration information memory 204 are respectively input to the functional block 201 and the selector 207 as well as the tri-state buffers, and exercises switching control over a configuration of an operator or the like inside the functional block 201 and selection by the selector 207, thereby changing the configuration.

As shown in FIG. 8, outputs of a plurality of tri-state buffers (such as the tri-state buffers 205-1 and 206-1) are connected to one (such as the bidirectional bus 202-1) of the bidirectional buses (202-1, 202-2, . . . ). Depending on a value of the configuration information memory 204 connected to the tri-state buffers (such as 205-1 and 206-1), the plurality of the tri-state buffers (205-1, 206-1) provides outputs to the same bus (such as the bus 202-1), which brings about a bus fight state. When the bus fight state continues for a long time, the device will be damaged. This may increase a possibility that the device will be defective, leading to a permanent failure. The same holds true for the pass transistor as well.

Generally, contents of the configuration information memory are generated by a development tool for the reconfigurable device. Specifically, a netlist created by a compiler or logic synthesis in advance is transferred to a layout and wiring tool, thereby generating the contents of the configuration information memory. With respect to the information (configuration information) stored in the configuration information memory, there are problems as follows.

It is supposed that a normal memory image is garbled by some reason before data is written or invalid data is written into the configuration information memory by a misoperation of a user. Further, incorrect data may be intentionally written into the configuration information memory.

Further, even if normal data has been written into the configuration information memory, the normal data may become incorrect data by a soft error caused by external radiation or the like. In semiconductors, the frequency of occurrence of such a soft error has increased due to advances in finer geometries. Thus, the need for taking measures arises in an application for which high reliability is demanded.

In either case, when incorrect data has been written into the configuration information memory, a plurality of tri-state buffers may provide outputs to one bidirectional bus. As measures when incorrect data has been written into the configuration information memory as described above, descriptions in Patent Document 4 (JP Patent Kokai Publication No. JP-A-2-032620), Patent Document 5 (JP Patent Kokai Publication No. JP-A-5-327477), Patent Document 6 (JP Patent Kokai Publication No. JP-P-2006-344223A), and the like are referred to. Patent Document 4 discloses a programmable logic array that allows diagnosis to be conducted on whether a logic operation actually executed by a logic array matches with a programmed logic operation. Patent Document 5 discloses a configuration in which after a system clock supplied to a gate array has been temporarily stopped, determination is made whether data read out from the gate array matches with original data read out from a memory device, thereby allowing inspection of whether occurrence of abnormality of data on the gate array actually in operation is present or not. Patent Document 6 discloses a configuration for detecting a false positive soft error of a programmable device.

None of the techniques can cope with a bus fight on programmable wiring resources composed of bidirectional lines, caused by writing of incorrect data, and a resulting damage to the device.

Further, in Patent Document 4 (JP Patent Kokai Publication No. JP-A-2-032620) and Patent Document 5 (JP Patent Kokai Publication No. JP-A-5-327477), it is necessary to set a diagnosis mode in order to check whether configuration information is normal or not. The check cannot be made during a normal operation. Accordingly, when a bus fight occurs during the normal operation of the reconfigurable device, the bus fight cannot be accommodated, and the damage to the device cannot be prevented.

In Patent Document 6 (JP Patent Kokai Publication No. JP-P-2006-344223A), when a soft error is detected in a configuration information memory, configuration information is externally read again. However, no measures are taken against the bus fight that may occur during the reading. Though no description or suggestion is given in Patent Document 6, when data in the configuration information memory becomes incorrect due to the soft error and an operation of the memory is temporarily stopped, it is desired that a function of resuming the operation from a point of time of the interruption be implemented. If execution must be started over again after content of the configuration information memory has been modified, it is difficult to use the reconfigurable device in an application for which high reliability is demanded.

The invention disclosed in this application has been invented, based on recognition of the problems described above by the inventors of this application. The invention is generally configured as follows.

A device according to one aspect (aspect) of the present invention includes: a switch with an output thereof connected to buses that mutually connect functional blocks, the switch being on-off controlled based on information stored in a configuration information memory;

an error detection circuit that detects an error in the configuration information memory; and a circuit that sets the switch to be turned off, based on a result of error detection when the error in the configuration information memory is detected by the error detection circuit.

The present invention includes a plurality of the switches being respectively on-off controlled, based on associated information stored in said configuration information memory. Outputs of the switches are connected to one or a plurality of the buses. The switches are commonly set to an off state, when the error in said configuration information memory is detected by said error detection circuit.

The configuration information memory in the present invention may include:

a logic circuit that performs control of masking transmission of the information stored in said configuration information memory to a control terminal of said switch, based on the result of an error detection in said configuration information memory by said error detection circuit. The switch may be on-off controlled, based on an output of said logic circuit in said configuration information memory.

The present invention may include an error holding circuit that holds an error detection signal output from said error detection circuit. When an output of said error holding circuit indicates the presence of an error in said configuration information memory, the logic circuit delivers a value that sets said switch to an off-state to the control terminal of said switch, thereby masking the transmission of the information stored in said configuration information memory to the control terminal of said switch.

The present invention may include a reset circuit that resets said error holding circuit to an error-free state. When the error in said configuration information memory is detected by said error detection circuit and then the error is temporarily held by said error holding circuit, after said error holding circuit is reset to the error-free state, the error holding circuit holds the error even if no error is detected by said error detection circuit, based on the output of the logic circuit in said configuration information memory.

The present invention may include a circuit that notifies the error in said configuration information memory to a state transition controller, when an output of said error detection circuit indicates the presence of an error in said configuration information memory and generates a signal for stopping a predetermined operation.

The present invention may include:

a state transition table that receives a current state and outputs a next state;

a selection circuit that selects the state output from said state transition table, based on an event identification code;

an event occurrence determination circuit that outputs a signal which stops a predetermined operation when the event identification code indicates a predetermined value and controls said selection circuit so that said selection circuit selects a predetermined state; and a circuit that outputs a signal which stops an operation in an active state, when at least one of the signal that stops the operation, from said event occurrence determination circuit, and an error detection signal from said error detection circuit is in the active state.

In the present invention, every physically adjacent bits in said configuration information memory are divided into a plurality of groups. The reconfigurable device according to the present invention may further include a circuit and performs error detection for each of said groups, as said error detection circuit.

In the present invention, every physically adjacent bits of memory cells in the configuration information memory may be divided into a plurality of groups, and a redundant bit may be assigned to each group. The reconfigurable device according to the present invention may further include a circuit that performs error detection with a redundant bit included therefor, for each group, as the error detection circuit, and generates an overall error detection result based on results of error detection in the groups.

The present invention may include:

a switch having an output coupled to a bus that mutually connects functional blocks, said switch being on-off controlled based on information stored in a configuration information memory;

an error detection circuit that detects an error in said configuration information memory; and a circuit that sets the output of said switch to a predetermined value, responsive to an error detection by said error detection circuit.

In the present invention, the circuit that sets the output of the switch to the predetermined value device may include a logic circuit disposed at a stage preceding to said switch. The logic circuit may receive a signal to be supplied to an input of said switch and an error detection signal from said error detection circuit. The logic circuit may deliver to said switch the signal to be supplied to the input said switch when the error is not detected by said error detection circuit, and may set an output thereof to a predetermined value and delivering the output of said predetermined value to the input of said switch when the error is detected by said error detection circuit.

In the present invention, the switch may comprise a tri-state buffer. Alternatively, the switch may comprise a pass transistor.

In the present invention, the configuration information memory may include a redundant bit for an error check.

In the present invention, the configuration information memory may include a parity bit. In the present invention, parity for an error check may be embedded in at least one predetermined bit in the configuration information memory. In the present invention, the error detection circuit may detect a parity error.

In the present invention, the configuration information memory may be disposed corresponding to each of the functional blocks; and the error detection circuit may be disposed corresponding to each of the functional blocks, and may receive an output signal of the configuration information memory corresponding to the error detection circuit. In the present invention, the buses may comprise bidirectional buses disposed between a plurality of the functional blocks disposed in an array form.

The meritorious effects of the present invention are summarized as follows.

According to the present invention, when content of the configuration information memory becomes incorrect, the incorrect content is detected. The output to each of the buses can be thereby immediately stopped and occurrence of a bus fight can be thereby prevented.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

A reconfigurable device in accordance with one mode of the present invention is configured to detect an error in a configuration information memory and then forcibly cause an output of a tri-state buffer or a pass transistor (switch) that provides an output to a bidirectional bus to be in a high-impedance state. With this arrangement, the output to the bus can be immediately stopped when the error has occurred in the configuration information memory, and occurrence of a bus fight can be prevented. A description will be given below in connection with some specific exemplary embodiments.

First Exemplary Embodiment

Figure 1:
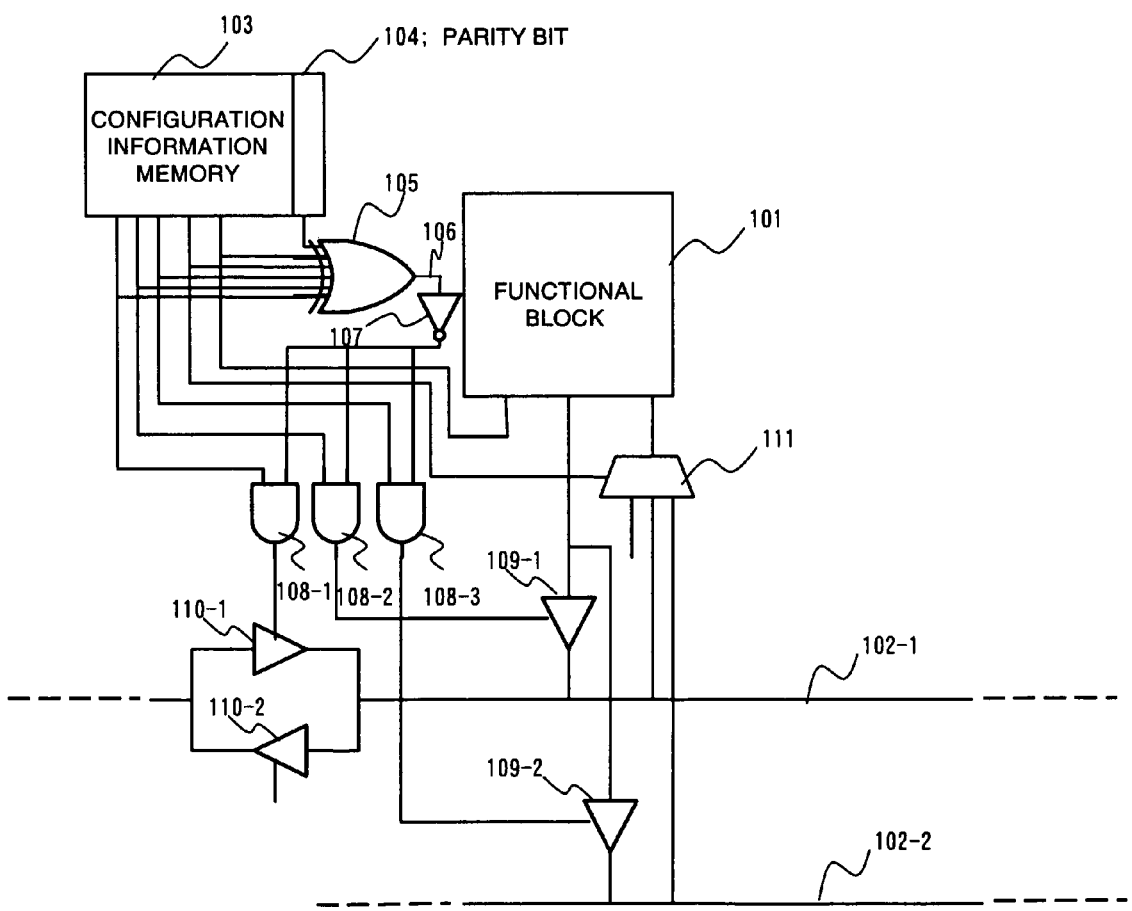
FIG. 1 is a diagram showing a configuration of a first exemplary embodiment of the present invention.

FIG. 1 is a diagram showing a configuration of a first exemplary embodiment of the present invention. Referring to FIG. 1, according to this exemplary embodiment, a redundant bit (parity bit) 104 for storing parity is additionally provided for a configuration information memory 103, and also provided a parity error detection circuit 105 that receives a plurality of output signals of the configuration information memory 103 and the parity bit 104, thereby detecting a parity error. In the parity bit 104 in an even parity system, 0 or 1 is set so that the number of 1s in the output signals of the configuration information memory 103 and the parity bit 104 is even. On the other hand, in the parity bit 104 in an odd parity system, 0 or 1 is set so that the number of is in the output signals of the configuration information memory 103 and the parity bit 104 is odd.

Though no particular limitation is imposed on the present invention, the parity error detection circuit 105 is composed by an exclusive logical sum (EXOR: exclusive OR) circuits in this exemplary embodiment. The parity error detection circuit 105 receives the output signals of the configuration information memory 103 and the parity bit 104 and checks whether the number of 1s in the input signals is even or odd. When the number of 1s is odd in the even parity system, the parity error detection circuit 105 outputs a parity error (causes an output signal 106 thereof to be HIGH). On the other hand, in the case of the odd parity system, when the number of 1s in the input signals is even, the parity error detection circuit 105 outputs a parity error (causes the output signal 106 to be HIGH). The parity error detection circuit 105 receives six (binary) signals which is the sum of five output signals of the configuration information memory 103 and the parity bit 104, and makes a parity check on these six binary signals. Assume that the six input signals are indicated by X1 to X6, respectively, and that the even parity system is employed. Then, the parity error detection circuit 105 may be formed, using five two-input exclusive OR circuits exor, for example. In this case, a result of parity error detection is given by arithmetic operation of exor (exor (exor (X1, X2), exor (x3, x4), exor (x5 and x6)). When the number of 1s in the input signals X1 to X6 is even, the result of parity error detection becomes 0 (with no parity error). When the number of 1s is odd, the result of parity error detection becomes 1 (including a parity error). In FIG. 1, the number of the output signals of the configuration information memory 103 is set to five (which is a sum of five signals for a functional block 101, a selector 111, and tri-state buffers 109-1, 109-2, and 110-1). The present invention, however, is not of course limited to such a configuration.

Output signals of logical product (AND) circuits 108-1, 108-2, and 108-3 each of which performs a logical product operation on a signal obtained by inverting the output signal 106 of the parity error detection circuit 105 by an inverter 107 and an output signal of the configuration information memory 103 are supplied to output control terminals of the tri-state buffers 110-1, 109-1, and 109-2, respectively. More specifically, when the output signal 106 of the parity error detection circuit 105 (referred to as a "parity error detection signal") is HIGH (at a time of occurrence of a parity error), an output of the inverter 107 goes LOW. Then, outputs of the AND circuits 108-1 to 108-3 are fixed at a LOW level irrespective of values of the output signals of the configuration information memory 103 (accordingly, the output signals of the configuration information memory 103 are masked). Then, the tri-state buffers 109-1, 109-2, and 110-1 are all set to an output disable state (with outputs thereof being in a high-impedance state). Though no particular limitation is imposed on the present invention, a tri-state buffer 110-2 is turned on or off based on an output of a configuration information memory of other adjacent cell, in an example shown in FIG. 1. In this case, a parity error detection signal of the configuration information memory of the other adjacent cell is used as a mask signal.

When the parity error detection signal 106 is LOW (with no parity error), the output of the inverter 107 goes HIGH. Then, the AND circuits 108-1 to 108-3 output the signals from the configuration information memory 103 without alteration. When the corresponding signals from the configuration information memory 103 are HIGH, the tri-state buffers 109-1, 109-2, and 110-1 are brought into an output enable state. When the corresponding signals from the configuration information memory 103 are LOW, the tri-state buffers 109-1, 109-2, and 110-1 are brought into the output disable state (with the outputs thereof being in the high-impedance state). Output signals of the configuration information memory 103 (configuration information) are supplied to the functional block 101 and the selector 111, respectively, in addition to being used for on/off control over the tri-state buffers. The output signals of the configuration information memory 103 perform switching control over a configuration of an operator and the like within the functional block 101 and selection among bidirectional buses 102-1, 102-2 or the like by the selector 111, thereby changing the configuration.

As described above, in this exemplary embodiment, the logic gates 108 for performing masking due to this parity error are inserted into control lines for the tri-state buffers or pass transistors that control bidirectional buses.

Further, the parity error detection is suitable in that overhead such as a hardware amount is small and a delay associated with error detection is small. In the exemplary embodiments which will be described below, descriptions will be given in the case of the parity. Error detection in the present invention, however, is not limited to a parity error. Other circuit for error detection such as a CRC (Cyclic Redundancy Check) or ECC (Error Correction Coding) may be of course employed.

The inversion of one bit in the configuration information memory 103 by a soft error or the like causes a parity error. Then, the outputs of the buffers that drive the buses controlled by the configuration information memory 103 in which the parity error has occurred are forcibly brought into the high-impedance state. No bus fight will therefore occur. In other words, when the configuration information is incorrect, the parity error will occur. Then, the outputs to the buses are forcibly stopped at once, and the buses are brought into a high-impedance state (floating state). Occurrence of the bus fight can be thereby prevented.

Even if incorrect information is present in the configuration information memory 103, there is some possibility that no bus fight can occur depending on a value of the incorrect information. However, once the bus fight has actually occurred, the device will be damaged. Accordingly, an immediate remedy must be taken at a point of time when a possibility of the bus fight arises. A practical value and effectiveness of the present invention remain unchanged.

The present invention may be of course applied to the switches such as the pass transistors that are connected to the buses and are subject to on/off control based on the outputs of the configuration information memory 103, in place of the tri-state buffers.

Second Exemplary Embodiment

Figure 2:
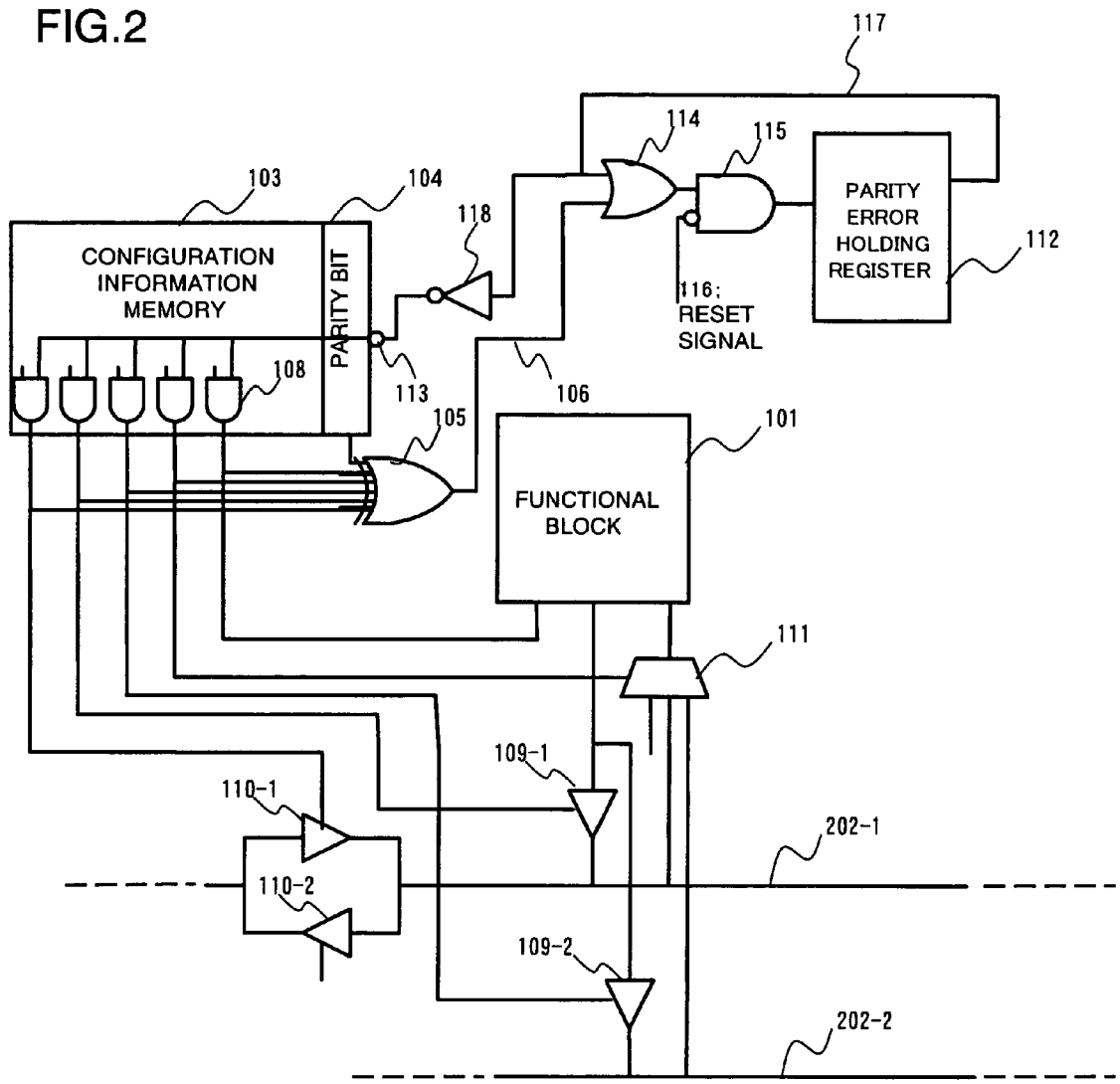
FIG. 2 is a diagram showing a configuration of a second exemplary embodiment of the present invention.

FIG. 2 is a diagram showing a configuration of a second exemplary embodiment of the present invention. In this exemplary embodiment, the gates (AND circuits) 108 for masking, used in the first exemplary embodiment, are included in a custom memory, as the configuration information memory 103, for area efficiency.

In this case, regardless of occurrence of a parity error in the configuration information memory 103, the outputs of the AND circuits 108, which are the outputs of the configuration information memory all become 0 (go LOW). In this case, when the parity bit 104 is 0 in the case of the even parity (or when the parity bit 104 is 1 in the case of the odd parity), for example, the output signal 106 of the parity error detection circuit 105 goes LOW (indicating that no parity error is present), the parity error will be canceled.

Then, it is arranged in this exemplary embodiment that a parity error holding register 112 is included, and once a parity error has occurred in the configuration information memory 103, a logic 1 is held in the parity error holding register 112. As a result, when the parity error has occurred, an error occurrence factor can be analyzed by reading out a value of the parity error holding register 112 after occurrence of the parity error. The parity error holding register 112 is reset to a state corresponding to absence of the parity error at a time of initialization or the like.

More specifically, referring to FIG. 2, this exemplary embodiment includes an output mask terminal 113 for receiving a signal that forcibly masks outputs of the configuration information memory 103, and the AND circuits 108 each of which performs a logical product operation on an associated output signal of the configuration information memory 103 and a signal from the output mask terminal 113. The output signal 106 of the parity error detection circuit 105 that receives the outputs of the AND circuits 108 within the configuration information memory 103 and the parity bit 104 is supplied to a first input of a two-input logical sum (OR) circuit 114. An output of an AND circuit 115 that receives an output signal of the two-input OR circuit 114 and (an inverted logic of) a reset signal 116 is supplied to the parity error holding register 112. An output signal 117 of the parity error holding register 112 is fed back to a second input of the two-input OR circuit 114. A signal obtained by inverting the output signal 117 of the parity error holding register 112 by an inverter 118 is supplied to the output mask terminal 113.

An operation of this exemplary embodiment will be described below.

When the parity error holding register 112 is reset, the reset signal 116 (of one shot pulse) is set to HIGH. Then, the AND circuit 115 outputs a LOW level, thereby resetting the output signal 117 of the parity error holding register 112 to the LOW level.

The output signal 117 of the parity error holding register 112 is kept LOW until a parity error occurs after reset cancellation (with the reset signal 116 driven LOW). In this case, a HIGH level is supplied to the output mask terminal 113 of the configuration information memory 103, and the AND circuits 108 within the configuration information memory 103 transmit and output the output signals of the configuration information memory 103 to the output control terminals of the tri-state buffers 109-1, 109-2, and 110-1, respectively. Then, the tri-state buffers 109-1, 109-2, and 110-1 are on-off controlled, based on the output signals of the configuration information memory 103. When there is no parity error in the configuration information memory 103 after the reset cancellation, the output signal (parity error detection signal) 106 of the parity error detection circuit 105 is LOW, the output signal of the OR circuit 114 is LOW, and the AND circuit 115 that receives the output signal of the OR circuit 114 supplies the LOW level to the parity error holding register 112. The output signal 117 of the parity error holding register 112 is then driven LOW.

When the parity error occurred in the configuration information memory 103 in this state, the parity error detection signal 106 output from the parity error detection circuit 105 goes HIGH. The output signal of the OR circuit 114 goes HIGH. Then, the output signal of the AND circuit 115 that receives the output signal of the OR circuit 114 and the reset signal 116 (at the LOW level) goes HIGH. Then, the output signal of the AND circuit 115 at the HIGH level is supplied to the parity error holding register 112. Upon reception of the signal at the HIGH level, the parity error holding register 112 is set, thereby causing the output signal 117 to go HIGH (in other words, the output signal 117 assumes a value indicating occurrence of the parity error). The output signal 117 (at the HIGH level) of the parity error holding register 112 is fed back to the OR circuit 114, and is supplied to the parity error holding register 112 through the AND circuit 115. Then, the output signal 117 of the parity error holding register 112 keeps HIGH. Further, the output signal 117 (at the HIGH level) of the parity error holding register 112 is inverted by the inverter 118, thereby supplying the LOW level to the output mask terminal 113 of the configuration information memory 103. The AND circuits 108 within the configuration information memory 103 all output the LOW level, thereby setting all the tri-state buffers 109-1, 109-2, and 110-1 to be the output disable state (with outputs thereof being in the high-impedance state).

In this exemplary embodiment, the output mask terminal 113 of the configuration information memory 103 is set to LOW, and all the AND circuits 108 within the configuration information memory 103 output the LOW level. The OR circuit 114 thereby outputs the HIGH level even when the parity error detection signal 106 output from the parity error detection circuit 105 goes LOW. Then, the output signal 117 of the parity error holding register 112 keeps HIGH. The parity error will not thereby canceled.

A function of forcibly masking all the outputs of the configuration information memory 103 is effective in terms of circuit protection and reduction of power consumption in a state where the device is stopped, in a state where the device is not stable, and a sleep state of the device. When the output mask function is already included in the configuration information memory 103 for these purposes, the gate (AND) circuits 108 for masking do not need to be additionally provided. In this case, however, all the outputs of the configuration information memory 103 will assume 0 at a time of a parity error, thereby canceling the parity error. By disposing the parity error holding register 112 described in this exemplary embodiment in this case, cancellation of the parity error can be avoided.

Third Exemplary Embodiment

By applying the present invention to a device like a configuration described in Patent Document 2 (JP Patent Kokai Publication No. JP-P-2001-312481A) or the like, which is capable of cancelling a predetermined operation (a write) by a signal from a state transition controller, this operation (write) canceling signal is forcibly made valid when a parity error occurs. With this arrangement, an operation of a cycle during which the parity error has occurred can be made invalid. When the parity error has occurred, the operation is forcibly interrupted. During the interruption, a configuration information write control circuit or the like, for example, analyzes an error occurrence factor, identifies a location of the configuration information memory where a soft error has occurred, and rewrites correct configuration information.

With this arrangement, when the parity error has occurred due to a temporary soft error, the error can be modified without resetting the device, and the operation can be thereby resumed. Further, during occurrence of the parity error, buses are forcibly brought into the high-impedance state. Accordingly, even if it takes time to analyze the error and restore the device, the device will not be damaged.

Figure 3:
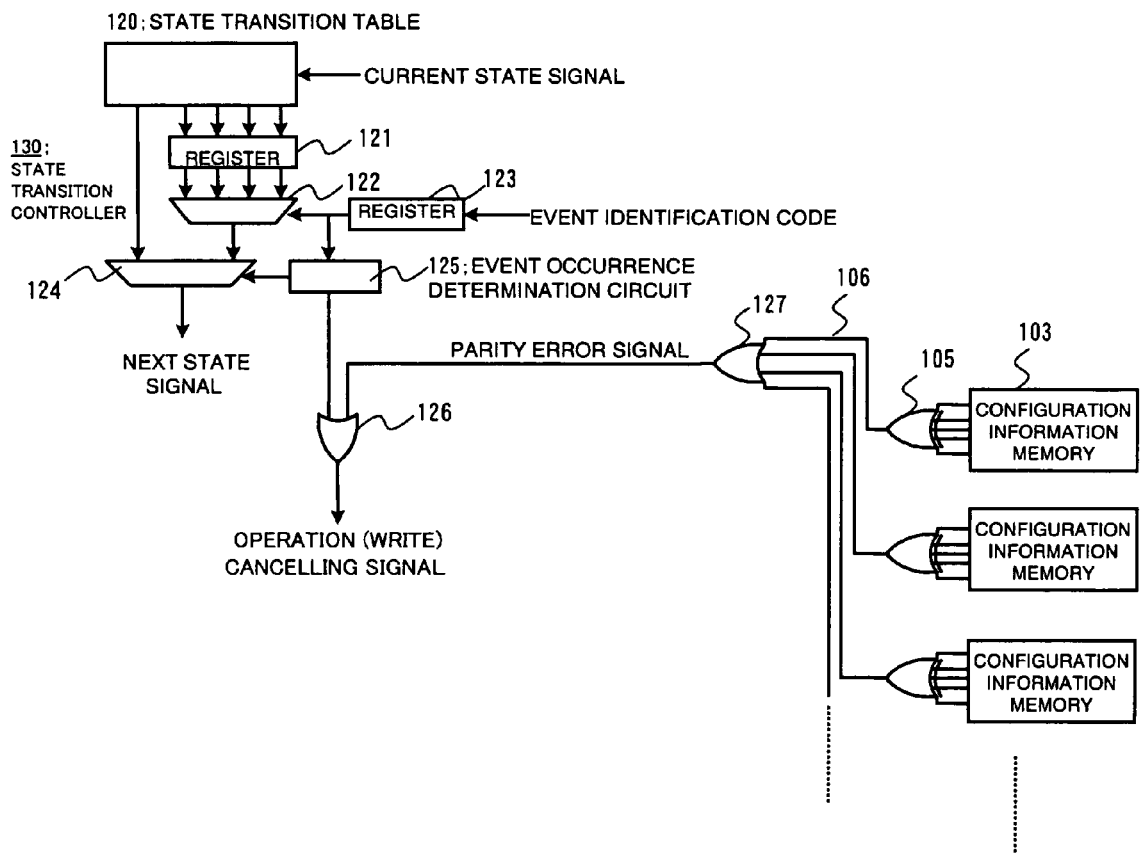
FIG. 3 is a diagram showing a configuration of a third exemplary embodiment of the present invention.

FIG. 3 is a diagram showing a configuration of a third exemplary embodiment of the present invention. Referring to FIG. 3, a state transition controller 130 in this exemplary embodiment includes a state transition table 120, a register 121, a selector 122, and a selector 124. The state transition table 120 receives a current state signal and outputs (a plurality of) state numbers indicating a state next to the state of an entry accessed by the current state signal. The register 121 holds outputs (state numbers) from the state transition table 120. The selector 122 receives outputs of the register 121 and selects a state number corresponding to an event identification code, based on an output of a register 123 that holds the event identification code. The selector 124 receives an output of the selector 122 and an output of the state transition table 120, and selects one of the output of the selector 122 and the output of the state transition table 120 as a next state signal, based on a result of determination by an event occurrence determination circuit 125. The event identification code may be formed of four bits. Then, the selector 122 may select the state number corresponding to a bit of 1 of the four-bit event identification code. The event occurrence determination circuit 125 controls the selector 124 so that when the event identification code indicates a predetermined value, the selector 124 selects the output of the selector 122 and when the event identification code indicates other predetermined value, the selector 124 selects the output of the state transition table (such as a default state transition table) 120. When the event occurrence determination circuit 125 determines that an event in which the (write) operation must be canceled has occurred, based on the event identification code, the event occurrence determination circuit 125 outputs the operation cancelling signal.

In this exemplary embodiment, an output of an OR circuit 126 that performs a logical sum operation on the operation cancelling signal from the event occurrence determination circuit 125 and an output of an OR circuit 127 is output as an operation cancelling signal. The OR circuit 127 performs a logical sum operation on parity error detection signals 106 of parity error detection circuits 105.

When the ECC is employed, a one-bit soft error can be corrected. However, the ECC is larger than the parity in terms of circuit overhead. Generally, the reconfigurable device includes a large amount of the configuration information memory. Accordingly, provision of all of the configuration information memories with ECC circuits increases the area of the reconfigurable device. Further, even if error correction is made by the ECC, data in the configuration information memory 103 still includes an error. Accordingly, it is necessary to modify this data. When the data is left with the error included therein, correction cannot be made when a soft error occurs again. In other words, even if corrected data can be immediately obtained, the data in the configuration information memory needs to be modified.

According to this exemplary embodiment, when one-bit soft error has occurred in the configuration information memory 103, for example, the operation cancelling signal is immediately activated, thereby stopping the operation. Then, the error in the configuration information memory 103 is modified, and then the operation is resumed. Correction of the soft error can be thereby substantially implemented. This exemplary embodiment is configured to detect a parity error. The overhead can be thereby reduced more than with the ECC.

Fourth Exemplary Embodiment

Due to shrinkage in the dimensions of memory cells caused by a progress in a micro-fabrication technologies of semiconductor processes, soft errors may simultaneously occur in adjacent memory cells. When all memory cells are handled as one group and when such errors have occurred, the errors cannot be detected by parity.

Figure 4:
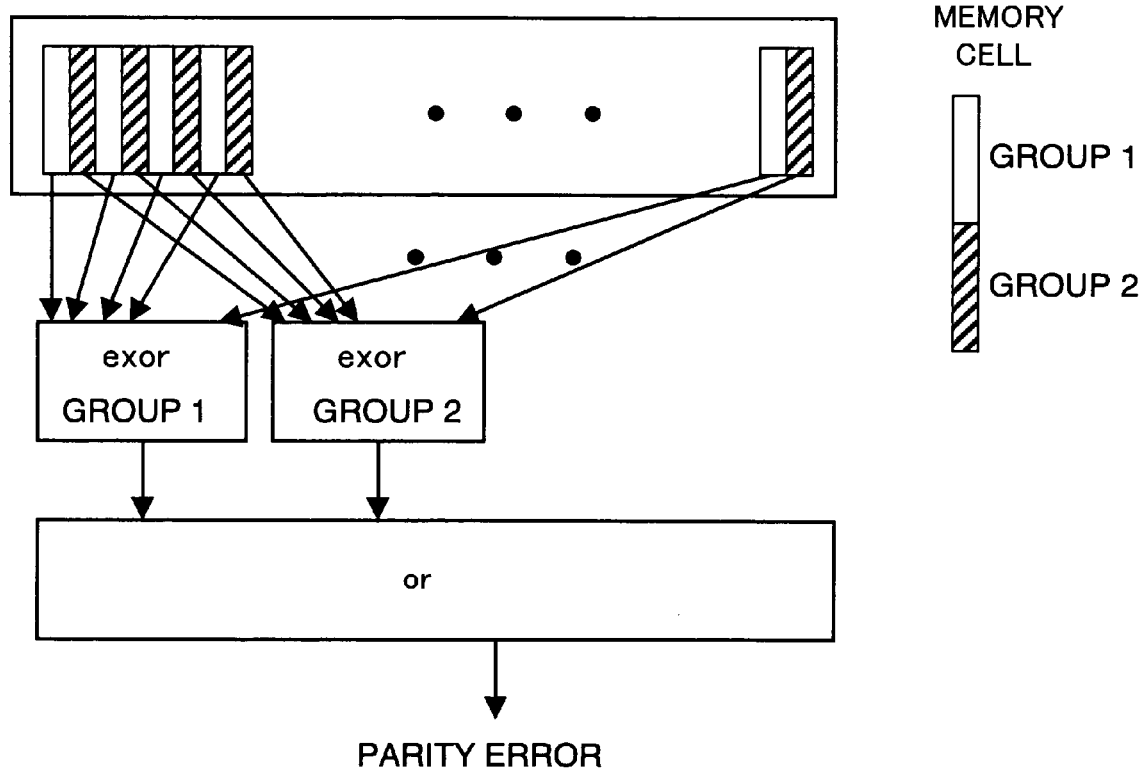
FIG. 4 is a diagram explaining a fourth exemplary embodiment of the present invention.

FIG. 4 is a diagram showing a configuration of a fourth exemplary embodiment of the present invention. FIG. 4 shows memory cell images in the configuration information memory (CFGM). A plurality of memory cells installed together are grouped so that adjacent memory cells do not fall into the same group. Then, parity detection is performed individually for each group. Parities detected individually are logically summed by a logical sum (OR) circuit to become a parity error signal. With this arrangement, when each of adjacent memory cells simultaneously causes an error, the error can be detected. In FIG. 4, the adjacent memory cells (outline and hatched memory cells) are alternately divided into two groups. The number of groups is not of course limited to two.

Fifth Exemplary Embodiment

When a parity bit is automatically generated inside the device at a time of writing configuration information into the device, a soft error can be accommodated. However, when incorrect data has been originally written, such incorrect data cannot be accommodated. This is because the parity bit corresponding to the incorrect data is generated, so that a parity error does not occur.

In this exemplary embodiment, when a configuration information image is generated in advance by a development tool or the like, the development tool embeds a parity bit in the configuration information memory (CFGM).

With this arrangement,
 when data has been garbled for some reason before a normal memory image is written, or
 when invalid data is written into the configuration information memory by a misoperation of a user,
a parity error will occur, and an illegitimate operation can be thereby prevented.

Especially when the number of parity bits is large, a possibility that a normal parity is accidentally generated is reduced. Accordingly, when incorrect data is written into configuration information, a parity error will occur, and a possibility that the illegitimate operation can be prevented is thereby increased.

Further, when not only the number of redundant bits for error detection is simply increased but also positioning or a combination of the redundant bits is set to be irregular in order to detect incorrect configuration information, it becomes difficult to analyze the configuration information. Thus, this arrangement is greatly effective for intentional injustice.

When the positioning or the combination of the redundant bits for error detection is unknown, and further when a large number of parity bits are present, it is almost impossible to falsify the configuration information and get through the error detection.

Figure 5:
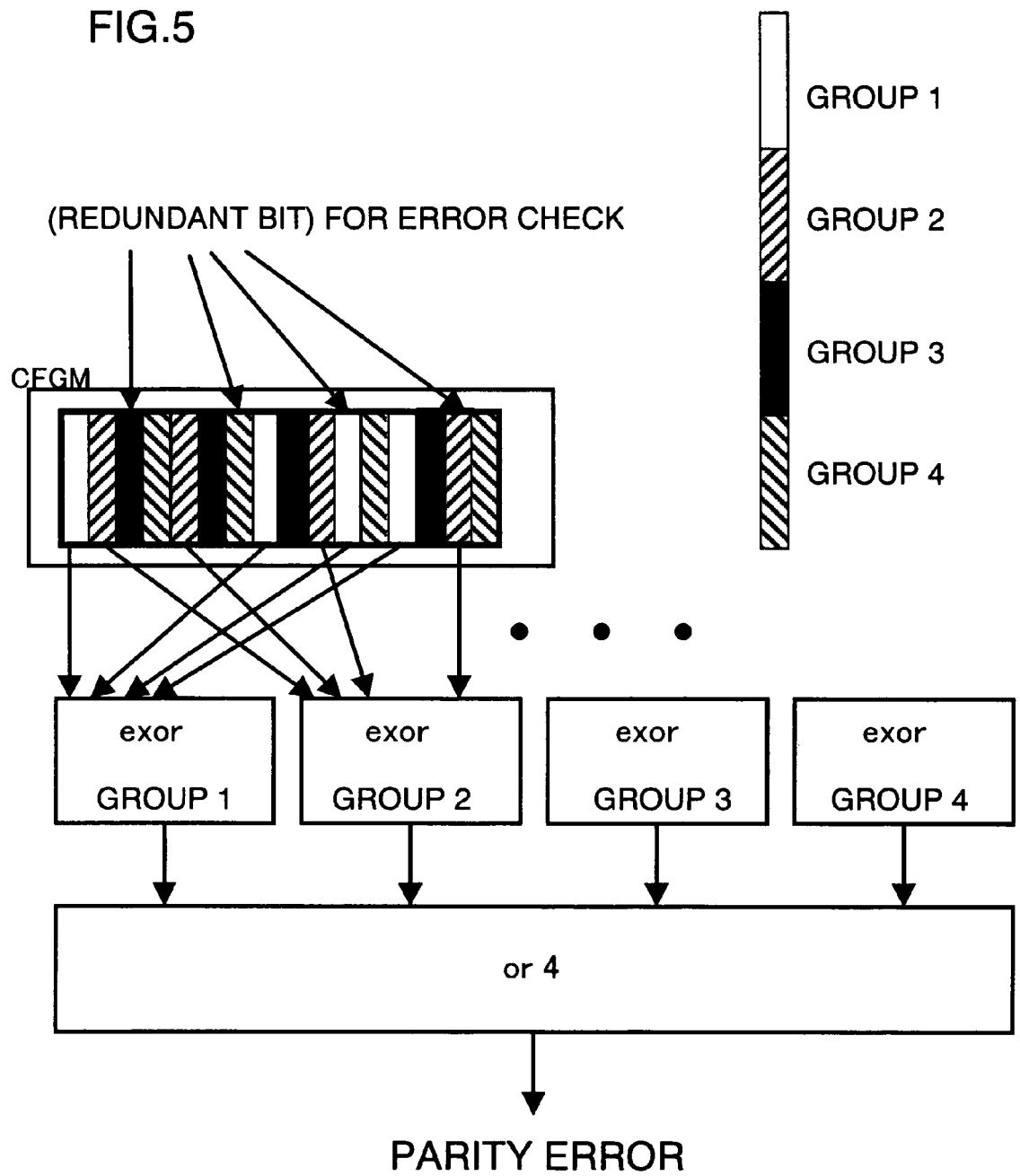
FIG. 5 is a diagram explaining a fifth exemplary embodiment of the present invention.

In FIG. 5, memory cells are divided into four groups from group 1 to group 4. An error check redundant bit is assigned to each of the groups 1 to 4. Then, for each group, parity error detection is performed, with the redundant bit included therefor, by an exclusive logical sum (exor) circuit. A parity error is detected by a four-input logical sum (or4) circuit that receives results of detection in the groups.

Sixth Exemplary Embodiment

In the exemplary embodiments described above, when an error is detected, the outputs of the tri-state buffers connected are immediately brought into the high-impedance state, thereby preventing a bus fight.

In order to prevent the bus fight, in addition to bringing all of the outputs of the tri-state buffers connected to the buses into the high-impedance state, there is also a method of making the outputs of all the connected tri-state buffers 0 or 1.

In a sixth exemplary embodiment of the present invention, as a variation of the first exemplary embodiment shown in FIG. 1, when a parity error in the configuration information memory is detected, output values of the tri-state buffers of which outputs are connected to the buses are forcibly made uniform.

Figure 6:
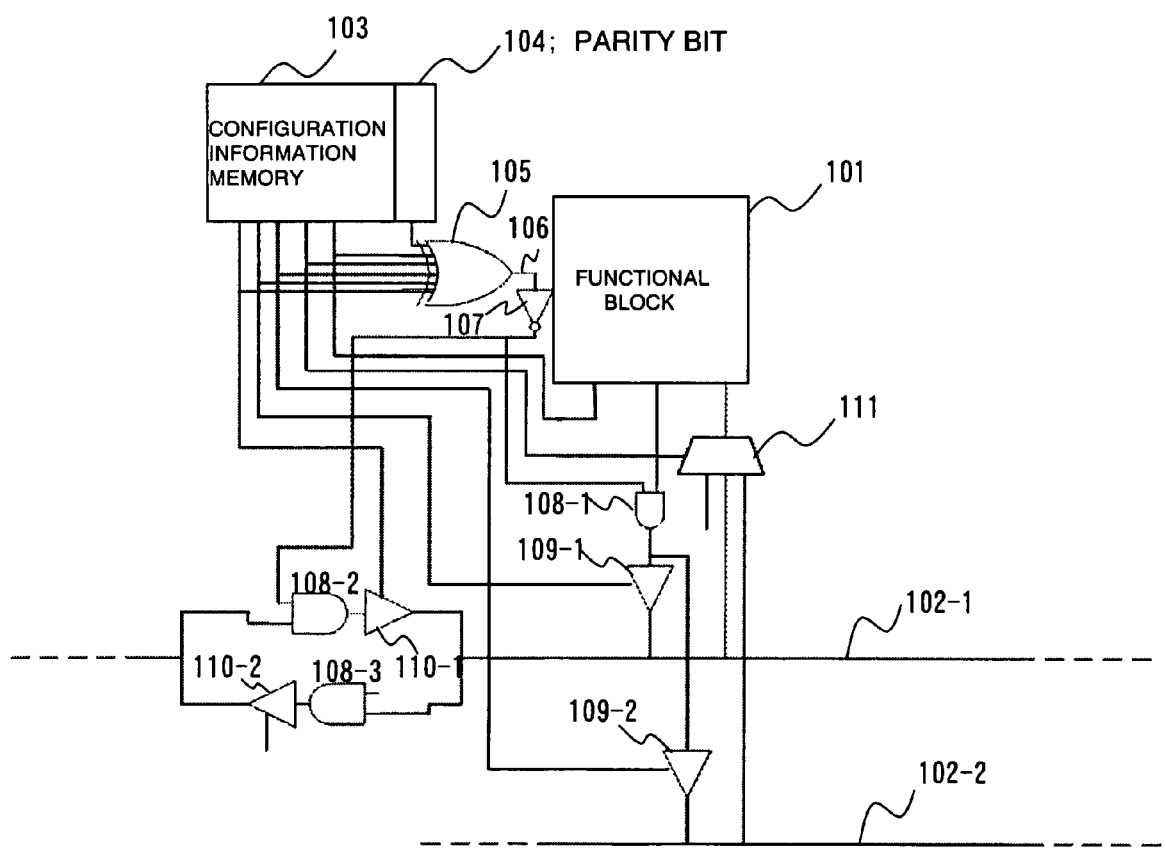
FIG. 6 is a diagram showing a configuration of a sixth exemplary embodiment of the present invention.
Figure 7:
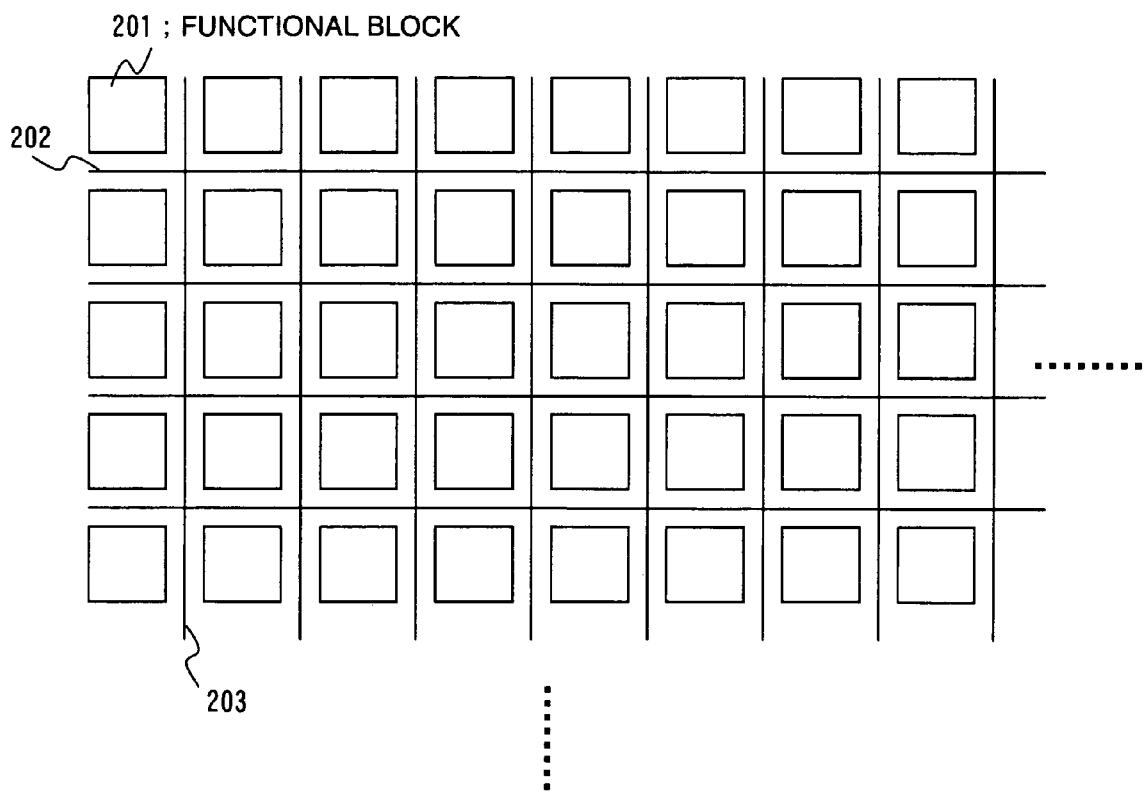
FIG. 7 is a diagram showing a configuration of a reconfigurable device of a related art.
Figure 8:
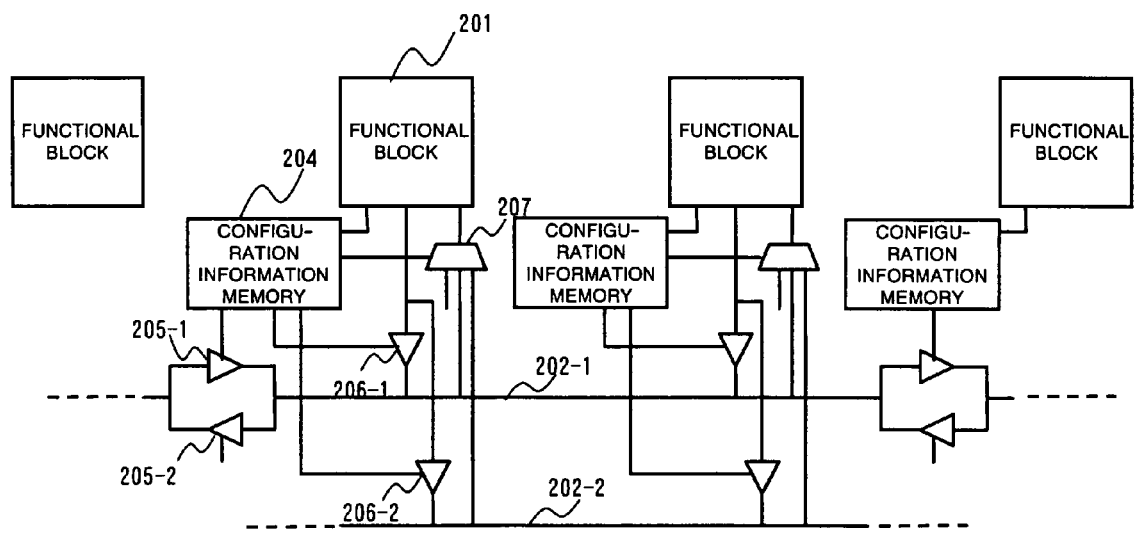
FIG. 8 is a diagram showing an example of programmable wiring using bidirectional buses in the related art.

FIG. 6 is a diagram showing a configuration of the sixth exemplary embodiment of the present invention. Referring to FIG. 6, in this exemplary embodiment, the output signals of the configuration information memory 103 are supplied to the output control terminals of the tri-state buffers 109-1, 109-2, and 110-1, respectively. The AND circuit 108-1 is inserted into a data input path in the preceding stage of the tri-state buffers 109-1 and 109-2, and the AND circuit 108-2 is inserted into a data input path in the preceding stage of the tri-state buffer 110-1. The output of the inverter 107 that inverts the output signal 106 of the parity error detection circuit 105 is input to the AND circuits 108-1 and 108-2. When a parity error occurs, the output of the inverter 107 goes LOW. Thus, the AND circuit 108-1 supplies the LOW level to input terminals of the tri-state buffer 109-1 and 109-2. Then, the AND circuit 108-2 supplies the LOW level to an input terminal of the tri-state buffer 110-1. In this exemplary embodiment, when the parity error is detected by the parity error detection circuit 105, buffer outputs to the buses 102-1 and 102-2 are forcibly made uniform to 0 (Low level). In this case, the buses 102-1 and 102-2 do not need to be brought into the high-impedance state. Thus, this arrangement is effective when the buses are not desired to be brought into the high-impedance state for the reason that bus holders cannot be used.

In this exemplary embodiment, the gates (AND circuits) 108-1, 108-2, and 108-3 for masking are inserted into the data buses. Thus, delays of the circuits mapped on the reconfigurable device are correspondingly increased more than in the first exemplary embodiment.

An operation and effect of this exemplary embodiment will be described below.

When incorrect configuration information is supplied to the reconfigurable device, or when the configuration information becomes incorrect due to a soft error, occurrence of a bus fight is prevented. The device is thereby prevented from being damaged.

In the reconfigurable device of a type provided with a state transition controller, when a soft error has occurred, an operation of the device can be temporarily stopped, and the operation can be resumed at a point of time of the stopping after the cause of the error has been analyzed and the device has been then restored.

A location where the soft error has occurred in the configuration information memory can be examined later.

When parity is generated within the device, originally written incorrect data cannot be detected even if a soft error can be detected by the parity error of the configuration information memory. Then, according to this exemplary embodiment, (a plurality of) (irregular) parities are embedded into specific bits in advance by a tool. When incorrect data is input, the incorrect data can be detected with high probability.

Respective disclosures of Patent Documents described above are incorporated herein by reference. Within the scope of all disclosures (including claims) of the present invention, and further, based on the basic technical concept of the present invention, modification and adjustment of the exemplary embodiment and the exemplary embodiments are possible. Further, within the scope of the claims of the present invention, a variety of combinations or selection of various disclosed elements are possible. That is, the present invention of course includes various variations and modifications that could be made by those skilled in the art according to all the disclosures including the claims and the technical concept.

What is claimed is:

1. A reconfigurable device comprising:
   a configuration information memory that stores information on a device configuration;
   a switch including an output coupled to a bus that mutually connects functional blocks;
   an error detection circuit that detects an error in said configuration information memory; and
   a circuit that sets said switch to an off state, responsive to the error detected by said error detection circuit, and controls the switch to an on-off state based on information stored in the configuration information memory.

2. The reconfigurable device according to claim 1, further comprising
   a plurality of the switches being respectively on-off controlled, based on associated information stored in said configuration information memory,
   outputs of the switches being coupled to one or a plurality of the buses, the switches being commonly set to an off state, when the error in said configuration information memory is detected by said error detection circuit.

3. The reconfigurable device according to claim 1, wherein said configuration information memory includes
   a logic circuit that performs control of masking transmission of the information stored in said configuration information memory to a control terminal of said switch, based on the result of an error detection in said configuration information memory by said error detection circuit, said switch being on-off controlled, based on an output of said logic circuit disposed in said configuration information memory.

4. The reconfigurable device according to claim 3, further comprising an error holding circuit that holds an error detection signal output from said error detection circuit, said logic circuit delivering a value that sets said switch to an off-state to the control terminal of said switch, thereby masking the transmission of the information stored in said configuration information memory to the control terminal of said switch, when an output of said error holding circuit indicates the presence of an error in said configuration information memory.

5. The reconfigurable device according to claim 4, further comprising a reset circuit that resets said error holding circuit to an error-free state;

wherein, when an error in said configuration information memory is detected by said error detection circuit and then the error is temporarily held by said error holding circuit, after said error holding circuit is reset to the error-free state, said error holding circuit holds the error even if no error is detected by said error detection circuit, based on the output of the logic circuit disposed in said configuration information memory.

6. The reconfigurable device according to claim 1, further comprising a circuit that notifies the error in said configuration information memory to a state transition controller, when an output of said error detection circuit indicates the presence of an error in said configuration information memory and generates a signal for stopping a predetermined operation.

7. The reconfigurable device according to claim 1, further comprising:

a state transition table that receives a current state and outputs a next state;

a selection circuit that selects the state output from said state transition table, based on an event identification code;

an event occurrence determination circuit that outputs a signal which stops a predetermined operation, when the event identification code indicates a predetermined value, and controls said selection circuit so that said selection circuit selects a predetermined state; and a circuit that outputs a signal which stops an operation in an active state, when at least one of the signal that stops the operation, from said event occurrence determination circuit, and an error detection signal from said error detection circuit is in the active state.

8. The reconfigurable device according to claim 1, wherein every physically adjacent bits in said configuration information memory are divided into a plurality of groups; and the reconfigurable device further comprises a circuit and performs error detection for each of said groups, as said error detection circuit.

9. The reconfigurable device according to claim 1, wherein every physically adjacent bits of memory cells in said configuration information memory are divided into a plurality of groups, a redundant bit being allotted to each of said plurality of groups; and the reconfigurable device further comprises a circuit that performs error detection with a redundant bit included therefor, for said each group, as said error detection circuit, and generates an overall error detection result based on results of error detection in said plurality of groups.

10. The reconfigurable device according to claim 1, wherein the switch comprises a tri-state buffer.

11. The reconfigurable device according to claim 1, wherein said configuration information memory comprises a redundant bit for an error check.

12. The reconfigurable device according to claim 1, wherein said configuration information memory comprises a parity bit.

13. The reconfigurable device according to claim 12, wherein said error detection circuit detects a parity error.

14. The reconfigurable device according to claim 1, wherein parity is embedded in at least one predetermined bit in said configuration information memory, in advance.

15. The reconfigurable device according to claim 1, wherein said configuration information memory is disposed corresponding to each of the functional blocks; and said error detection circuit is disposed corresponding to said each of the functional blocks, and receives an output signal of the configuration information memory corresponding to said error detection circuit.

16. The reconfigurable device according to claim 1, wherein said buses comprise bidirectional buses disposed between a plurality of the functional blocks disposed in an array form.

17. The reconfigurable device according to claim 1, wherein the configuration information memory controls the switch to control a masking of transmission of the information stored in the configuration information memory to stop an output of the information stored in the configuration information memory being transmitted to the bus when there is an error detection by the error detection circuit, and wherein the output from the switch to the bus is based on the information stored in the configuration information memory.

18. The reconfigurable device according to claim 1, wherein the output of the switch that drives the bus controlled by the configuration information memory in which an error detection has occurred, is forcibly set to a high-impedance state to avoid a conflict of the bus with another bus, coupled to the switch, that mutually connects the functional blocks, and wherein connections among the functional blocks are reconfigurable.

19. A reconfigurable device comprising:

a configuration information memory that stores information on a device configuration;

a switch including an output coupled to a bus that mutually connects functional blocks;

an error detection circuit that detects an error in said configuration information memory; and a circuit that sets the output of said switch to a predetermined value, responsive to the error detected by said error detection circuit, and controls the switch to an on-off state based on information stored in the configuration information memory.

20. The reconfigurable device according to claim 19, wherein said circuit that sets the output of said switch to the predetermined value device comprises a logic circuit disposed at a stage preceding to said switch, said logic circuit receiving a signal to be supplied to an input of said switch and an error detection signal from said error detection circuit, said logic circuit delivering to said switch the signal to be supplied to the input said switch when the error is not detected by said error detection circuit, and said logic circuit setting an output thereof to a predetermined value and delivering the output of said predetermined value to the input of said switch when the error is detected by said error detection circuit.

21. The reconfigurable device according to claim 19, wherein the switch comprises a tri-state buffer.

22. The reconfigurable device according to claim 19, wherein said configuration information memory comprises a redundant bit for an error check.

23. The reconfigurable device according to claim 19, wherein said configuration information memory comprises a parity bit.

24. The reconfigurable device according to claim 23, wherein said error detection circuit detects a parity error.

25. The reconfigurable device according to claim 19, wherein parity is embedded in at least one predetermined bit in said configuration information memory, in advance.

26. The reconfigurable device according to claim 19, wherein said configuration information memory is disposed corresponding to each of the functional blocks; and said error detection circuit is disposed corresponding to said each of the functional blocks, and receives an output signal of the configuration information memory corresponding to said error detection circuit.

27. The reconfigurable device according to claim 19, wherein said buses comprise bidirectional buses disposed between a plurality of the functional blocks disposed in an array form.

28. A method of reconfigurable device, the method comprising:

storing, by a configuration information memory, information on a device configuration;

switching, by a buffer including an output terminal coupled to a plurality of buses that mutually connect functional blocks, between an on and off state to control an output, for transmission to the buses;

detecting, by an error detection circuit, an error in the configuration information memory;

controlling, by a circuit, the switching of the buffer to the on and off state based on the information stored in the configuration information memory; and setting, by the circuit, the buffer to an off state in response to the error detected by the error detection circuit to stop the output to the buses by the buffer.

* * * * *